US012560627B2

(12) United States Patent
Kim et al.

(10) Patent No.: US 12,560,627 B2
(45) Date of Patent: Feb. 24, 2026

(54) CONTACT INSPECTION DEVICE

(71) Applicant: Samsung Display Co., LTD., Yongin-si (KR)

(72) Inventors: Byungsu Kim, Yongin-si (KR); Suk Ju Kang, Yongin-si (KR); Jung Min Lee, Yongin-si (KR); Eun Su Jun, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 145 days.

(21) Appl. No.: 18/539,028

(22) Filed: Dec. 13, 2023

(65) Prior Publication Data

US 2024/0248117 A1     Jul. 25, 2024

(30) Foreign Application Priority Data

Jan. 20, 2023    (KR) ........................ 10-2023-0008993

(51) Int. Cl.
   *G01R 1/04*        (2006.01)
   *G01R 31/28*      (2006.01)

(52) U.S. Cl.
   CPC ....... *G01R 1/0416* (2013.01); *G01R 31/2863* (2013.01)

(58) Field of Classification Search
   CPC .. G01R 1/0416; G01R 31/2863; G01R 31/69; G01R 1/02; G01R 1/04; G01R 31/2844; G01R 31/2825; G01R 31/2834; G01R 31/2867
   See application file for complete search history.

(56) References Cited

U.S. PATENT DOCUMENTS

| | | | | |
|---|---|---|---|---|
| 5,335,413 A | * | 8/1994 | Yamamoto | ............. H01R 43/22 |
| | | | | 324/756.02 |
| 7,924,037 B2 | * | 4/2011 | Tanabe | ............... G01R 31/2808 |
| | | | | 324/754.03 |
| 7,947,065 B2 | * | 5/2011 | Hammill, Sr. | ..... A61B 17/7037 |
| | | | | 606/267 |

FOREIGN PATENT DOCUMENTS

| | | | |
|---|---|---|---|
| CN | 205703845 | U | 11/2016 |
| CN | 107064770 | A | 8/2017 |
| CN | 110376403 | A | 10/2019 |
| CN | 210339430 | U | 4/2020 |
| KR | 920004852 | A | 3/1992 |
| KR | 100483368 | B1 | 4/2005 |
| KR | 100611608 | | 8/2006 |
| KR | 1020100059672 | | 6/2010 |
| KR | 101054865 | B1 | 8/2011 |
| KR | 101139329 | B1 | 4/2012 |
| KR | 101174851 | B1 | 8/2012 |
| KR | 101732629 | B1 | 5/2017 |
| KR | 20180025195 | A | 3/2018 |

(Continued)

*Primary Examiner* — Akm Zakaria
(74) *Attorney, Agent, or Firm* — CANTOR COLBURN LLP

(57) ABSTRACT

A contact inspection device includes a support; a contact inspection module including an inspection terminal which contacts and inspects an target; a crank module coupling the contact inspection module with the support and having a double crank structure; and a driving cylinder coupled to the support and the contact inspection module and moving the contact inspection module, where the driving cylinder applies a force to the contact inspection module to move, the force being oblique to the contact inspection module.

20 Claims, 5 Drawing Sheets

(56) References Cited

FOREIGN PATENT DOCUMENTS

| KR | 101901814 | B1 | 9/2018 |
| KR | 102183264 | B1 | 11/2020 |

* cited by examiner

CONTACT INSPECTION DEVICE

This application claims priority to and the benefit of Korean Patent Application No. 10-2023-0008993, filed in the Korean Intellectual Property Office on Jan. 20, 2023, the entire content of which are incorporated herein by reference.

BACKGROUND

(a) Field

The present disclosure relates to a contact inspection device.

(b) Description of the Related Art

In large-scale and automated production of products such as display device, inspection devices for detecting defects that may occur during production are widely used.

SUMMARY

In order for an inspection device contacting and inspecting a product to quickly and accurately detect a defect, the inspection device may be desired to quickly and accurately move and contact the product to be inspected.

The disclosure has been made in an effort to increase reliability of a contact inspection device.

An embodiment of the disclosure provides a contact inspection device including: a support; a contact inspection module including an inspection terminal which contacts and inspects a target; a crank module coupling the contact inspection module with the support and having a double crank structure; and a driving cylinder coupled to the support and the contact inspection module, where the driving cylinder applies a force to the contact inspection module to move, the force being oblique to the contact inspection module.

In an embodiment, the driving cylinder may be coupled to the support in a rotatable way.

In an embodiment, the driving cylinder may be coupled to the contact inspection module in a rotatable way.

In an embodiment, the driving cylinder may include a piston rod which is movable back and forth in a direction oblique to the contact inspection module, and the contact inspection module may obliquely move based on an oblique movement of the piston rod.

In an embodiment, the support may include a first holder coupled to the crank module, and a second holder coupled to the first holder with an angle therebetween.

In an embodiment, the contact inspection module may be coupled to the first holder, and the driving cylinder may be coupled to the second holder.

In an embodiment, the crank module may include two pairs of connecting rods having a substantially same length as each other, a plurality of first fasteners coupling a corresponding one of the connecting rods to the support in a rotatable way, and a plurality of second fasteners coupling a corresponding one of the connecting rods to the contact inspection module in a rotatable way.

In an embodiment, each of the first fasteners may include a bolt and a bearing, the bolt may include a head, a shank coupled to the bearing, and a thread fixed to the support, and the bearing may be coupled to a corresponding one of the connecting rods in a rotatable way.

In an embodiment, each of the second fasteners may include a bolt and a bearing, the bolt may include a head, a shank coupled to the bearing, and a thread fixed the contact inspection module, and the bearing may be coupled to a corresponding one of the connecting rods in a rotatable way.

In an embodiment, the contact inspection device may further include a height adjusting screw which adjusts a vertical position of the inspection terminal in the contact inspection device.

An embodiment of the disclosure provides a contact inspection device including: horizontal and vertical supports coupled to each other; a contact inspection module including an inspection terminal which contacts and inspects a target; a crank module coupled to the contact inspection module and the horizontal support and having a double crank structure; and a driving cylinder including a piston rod which is movable back and forth in an oblique direction and has an end rotatably coupled to the contact inspection module, where the driving cylinder is coupled to the vertical support in a rotatable way.

In an embodiment, the crank module may include two pairs of connecting rods having a substantially same length as each other, a plurality of first fasteners, where each of the first fasteners may couple a corresponding one of the connecting rods to the support in a rotatable way, and a plurality of second fasteners, where each of the first fasteners may couple a corresponding one of the connecting rods to the contact inspection module in a rotatable way.

In an embodiment, each of the first fasteners may include a bolt and a bearing, the bolt may include a head, a shank coupled to the bearing, and a thread fixed to the horizontal support, and the bearing may be coupled to a corresponding one of the connecting rods in a rotatable way.

In an embodiment, each of the second fasteners may include a bolt and a bearing, the bolt may include a head, a shank coupled to the bearing, and a thread fixed to the contact inspection module, and the bearing may be coupled to a corresponding one of the connecting rods in a rotatable way.

In an embodiment, the contact inspection device may further include a height adjusting screw which adjusts a vertical position of the inspection terminal in the contact inspection device.

An embodiment of the disclosure provides a contact inspection device including: a support; a contact inspection module including an inspection terminal which contacts and inspects a target; a driving member which applies a force to the contact inspection module to move, the force being oblique to the contact inspection module; and a horizontality maintaining member which maintains the contact inspection module to be substantially parallel with the support during a movement of the contact inspection module.

In an embodiment, the driving member may be coupled to the contact inspection module in a rotatable way, and the driving member may include a piston rod which is movable back and forth in a direction oblique to the contact inspection module and has an end coupled to the contact inspection module.

In an embodiment, the horizontality maintaining member may include two pairs of connecting rods having a substantially same length as each other, a plurality of first fasteners, each of which couples a corresponding one of the connecting rods to the support in a rotatable way, and a plurality of second fasteners, each of which couples a corresponding one of the connecting rods to the contact inspection module in a rotatable way.

In an embodiment, each of the first fasteners may include a bolt and a bearing, the bolt may include a head, a shank coupled to the bearing, and a thread fixed and coupled to the support, and the bearing may be coupled to a corresponding one of the connecting rods in a rotatable way.

In an embodiment, each of the second fasteners may include a bolt and a bearing, the bolt may include a head, a shank coupled to the bearing, and a thread fixed and coupled to the contact inspection module, and the bearing may be coupled to a corresponding one of the connecting rods in a rotatable way.

As described above, reliability of the contact inspection device may be increased.

DETAILED DESCRIPTION

Figure 1:
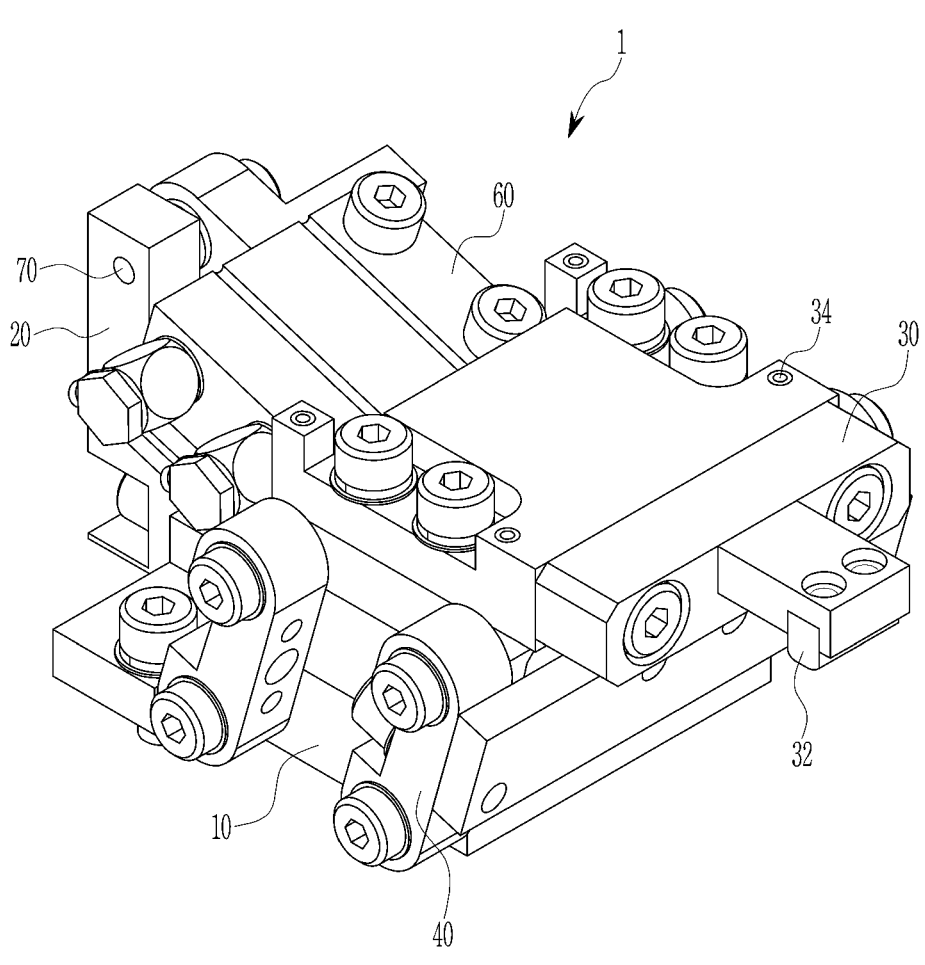
FIG. 1 shows a perspective view of a contact inspection device according to an embodiment of the present disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A contact inspection device according to an embodiment of the disclosure will now be described in detail with reference to FIG. 1 to FIG. 5.

Figure 2:
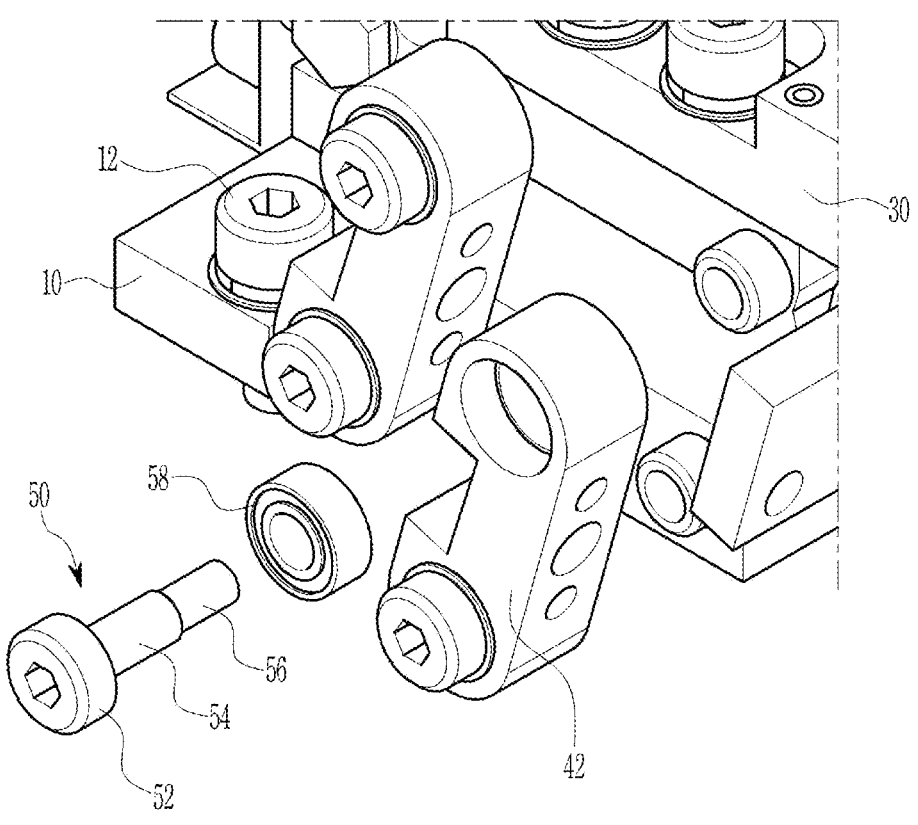
FIG. 2 is an enlarged exploded perspective view showing a portion of the contact inspection device shown in FIG. 1.
Figure 3:
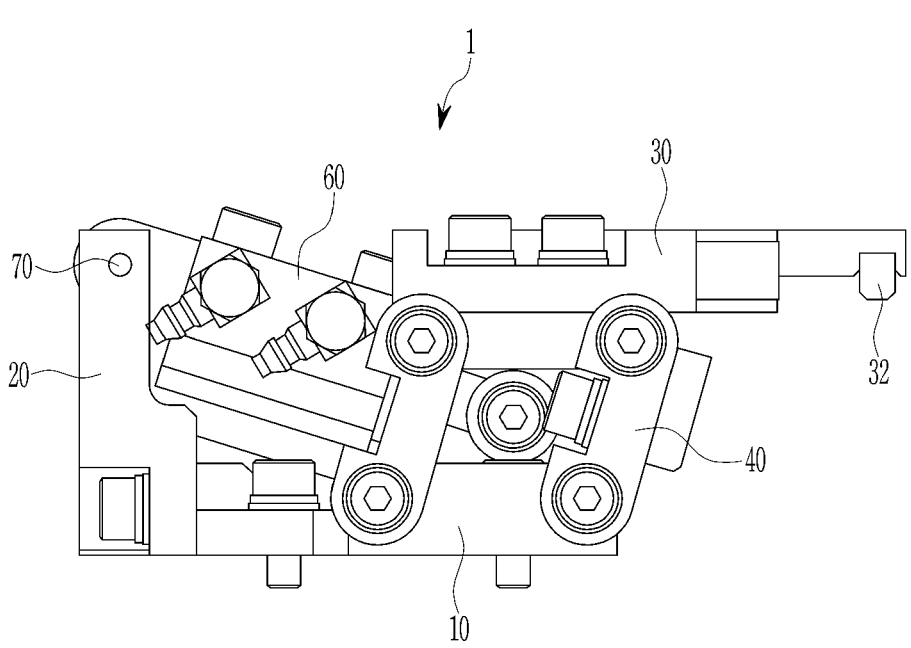
FIG. 3 and FIG. 4 show lateral views of the contact inspection device shown in FIG. 1, showing an opened state and a closed state, respectively.
Figure 4:
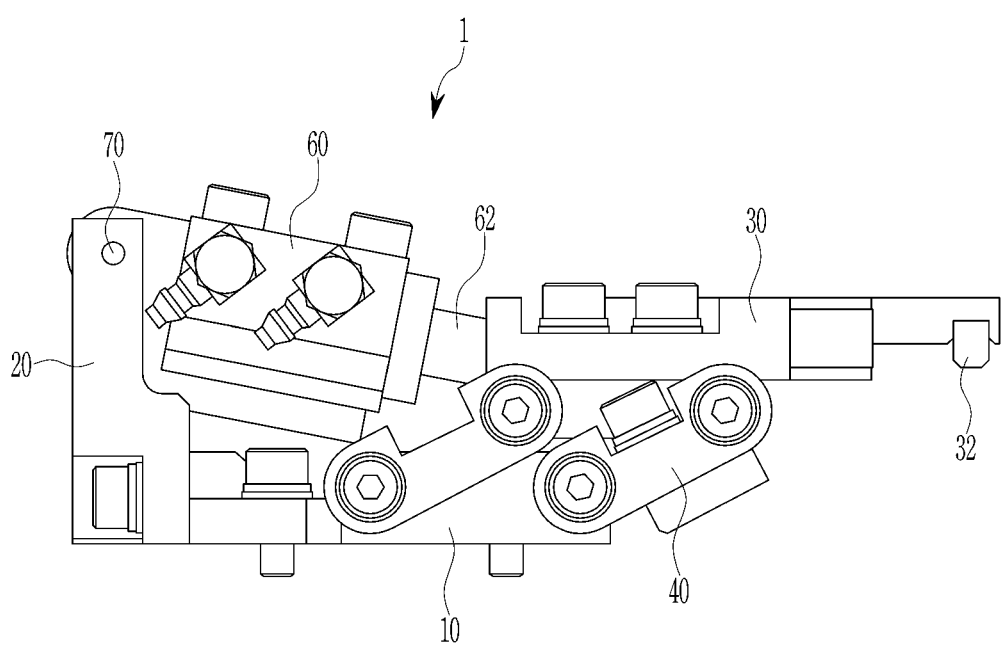
Figure 5:
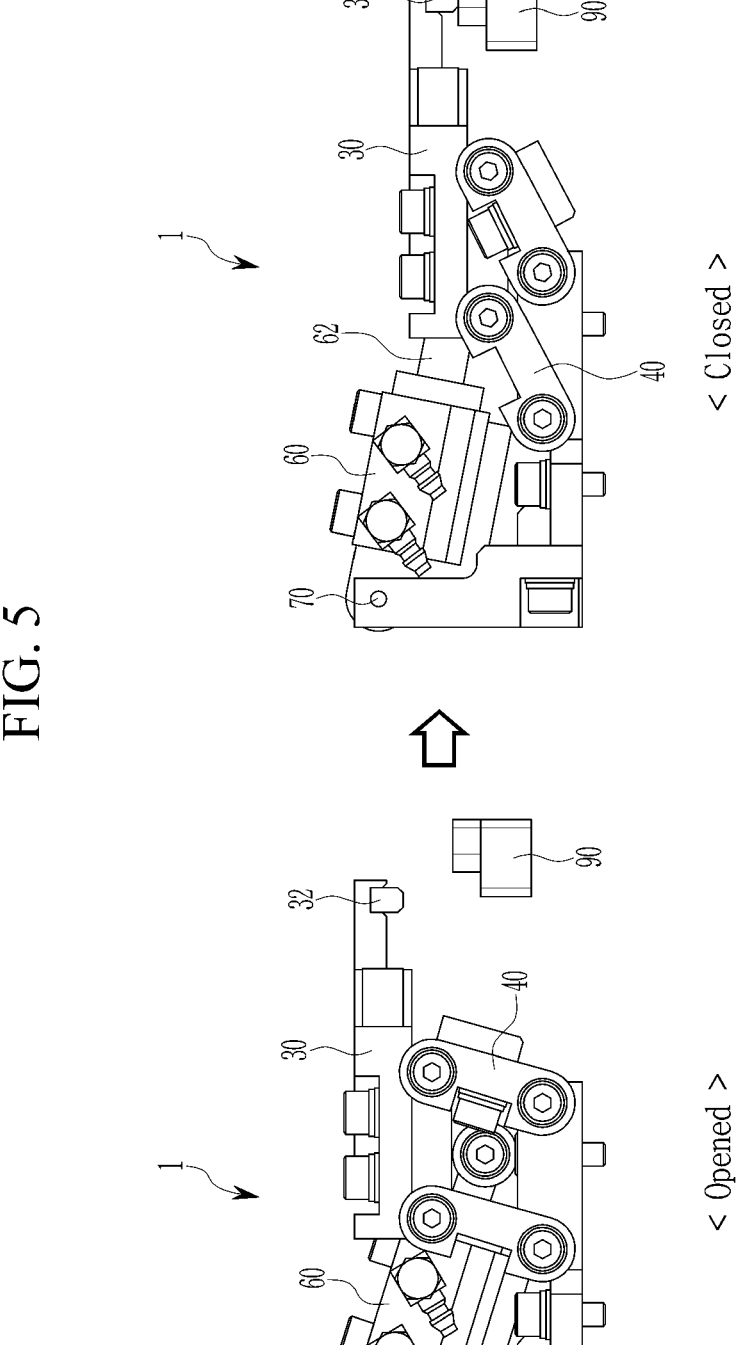
FIG. 5 shows operations of the contact inspection device shown in FIG. 1.

FIG. 1 shows a perspective view of a contact inspection device according to an embodiment of the present disclosure, and FIG. 2 is an enlarged exploded perspective view showing a portion of the contact inspection device shown in FIG. 1. FIG. 3 and FIG. 4 show lateral views of the contact inspection device shown in FIG. 1, FIG. 3 showing an opened state and FIG. 4 showing a closed state. FIG. 5 shows operations of the contact inspection device shown in FIG. 1.

Referring to FIG. 1, a contact inspection device according to an embodiment may include supports 10 and 20, a contact inspection module 30, a crank module 40, and a driving cylinder 60.

The supports 10 and 20 may include a horizontal support 10 (e.g., a first holder) and a vertical support 20 (e.g., a second holder) coupled to the horizontal support 10, and the horizontal support 10 may be fixed on a surface (e.g., a ground or a table) through a fixing member 12. The vertical support 20 and the horizontal support 10 may form a right angle, and but not being limited thereto, for example, the vertical support 20 and the horizontal support 10 may form various angles.

The contact inspection module 30 is configured to contact and inspect a target 90 to be inspected, for example, a display device module, and may include an inspection terminal 32 which contacts the target 90 for inspection. The contact inspection module 30 may include various electrical circuits for inspection. The contact inspection module 30 may also include a height adjusting member 34, for example, in a shape of a screw, for adjusting a relative height of the inspection terminal 32 in the contact inspection module 30.

The contact inspection module 30 is coupled to the driving cylinder 60. The driving cylinder 60 includes a piston rod 62 that can move back and forth using hydraulic pressure, etc., and has an end rotatably coupled to the contact inspection module 30, for example, through a bearing, to force the contact inspection module 30 to move, that is, to move the contact inspection module 30 in a predetermined direction. As shown in the figures, the piston rod 62 may not be parallel to the contact inspection module 30 but may be oblique thereto.

The driving cylinder 60 may be obliquely coupled to the vertical support 20, for example, through a shaft 70 along with a bearing, etc., such that the driving cylinder 60 is rotatable around the shaft 70. Similarly, the piston rod 62 may be rotatable around a shaft (not shown) of the contact inspection module 30, and the shaft may be parallel to the shaft 70 at the vertical support 20.

The contact inspection module 30 is coupled to the horizontal support 10 through the crank module 40. Referring to FIG. 2, the crank module 40 has a double crank structure including two pairs of rod members or connecting rods 42 and four pairs of fastening members or fasteners 50. The connecting rods 42 may have substantially the same length and may be arranged in parallel to each other. Each of the connecting rods 42 may be rotatably coupled to both the horizontal support 10 and the contact inspection module 30 through a pair of the fasteners 50. In an embodiment, for example, each fastener 50 may include a bolt including a head 52, a shank 54, and a thread 56. The thread 56 of the bolt may be fixed to either of the contact inspection module 30 or the horizontal support 10, and the bolt may be rotatably coupled to one of the connecting rods 42 through a bearing 58 coupled to the shank 54. Therefore, when the contact inspection module 30 moves, the connecting rods 42 may rotate around the shafts of the bolts coupled to the horizontal support 10 and the shafts of the bolts coupled to the contact inspection module 30 so that the contact inspection module 30 may maintain its horizontality.

An operation of the contact Inspection device according to an embodiment of the disclosure will now be described in detail with reference to FIG. 5.

Referring to FIG. 5, a standby state before starting an inspection is referred to as an "opened" state in which the piston rod 62 of the driving cylinder 60 has moved toward a main body of the driving cylinder 60, that is, a length of a portion of the piston rod 62 exposed to the outside (hereinafter, referred to as an "exposed length") is short. In this state, the contact inspection module 30 may maintain its horizontality or parallelism to the horizontal support 10 due to the constraint by the crank module 40, while the contact inspection module 30 may be oblique to the piston rod 62 of the driving cylinder 60.

When a target 90 to be inspected such as a display device module is ready, the inspection terminal 32 of the contact inspection module 30 is allowed to contact and perform an inspection on the target 90. The target 90 may be disposed lower than and external to the inspection terminal 32.

For contacting the inspection terminal 32 with the target 90, hydraulic pressure is applied in the opened state to push the piston rod 62 to move outwardly, and the movement of the piston rod 62 forces the contact inspection module 30, which is rotatably coupled to the piston rod 62, to move outwardly and downwardly, thereby approaching the target 90. As the piston rod 62 is coupled to the contact inspection module 30 in a slanted way, the force applied by the piston rod 62 to the contact inspection module 30 is directed in an oblique direction. Due to the constraint by the double crank structure of the crank module 40 coupled to the contact inspection module 30 as described above, the contact inspection module 30 maintains its horizontality during the movement as well as before and after the movement.

The contact inspection module 30 moves until the inspection terminal 32 of the contact inspection module 30 contacts the target 90 and then the contact inspection module 30 stops a movement to be in the "closed" state. In this state, the target 90 is inspected through the inspection terminal 32.

In the closed state, when the vertical position of the inspection terminal 32 is incorrect for the inspection of the target 90, for example, too far or too close to the target 90 in the vertical direction, the vertical position of the inspection terminal 32 may be adjusted using the height adjusting member 34.

In embodiments, the contact inspection module 30 may approach and apply a force to the target 90 in an inclined direction while maintaining its horizontality, and thus it may contact the inspection terminal 32 with uniformly distributed pressure, thereby increasing the reliability of inspection.

In a case, for example, where a plurality of terminals to be contacted by the inspection terminal 32 may be arranged in multiple rows in a display device module, the pressures on different rows of the terminals to contact the inspection terminal 32 may be different from each other, such that errors may occur in inspection results. In an embodiment of the invention, the stationary horizontality of the contact inspection module 30 may enable all the rows of the terminals to be applied with a same pressure as each other, thereby increasing the reliability of the inspection.

In an embodiment of the invention, the piston rod 62 of the driving cylinder 60 applies an oblique force to the contact inspection module 30 to move so that the force on the terminal(s) of the target 90 by the inspection terminal 32 of the contact inspection module 30 may be greater than that in a case of pushing the contact inspection module 30 with a horizontal force parallel to the contact inspection module 30 to move, thereby providing a stable contact to the target 90 during inspection.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A contact inspection device comprising:
a support;
a contact inspection module including an inspection terminal which contacts and inspects a target;
a crank module coupling the contact inspection module with the support and having a double crank structure; and a driving cylinder coupled to the support and the contact inspection module, wherein the driving cylinder applies a force to the contact inspection module to move, a direction of the applied force being oblique to the contact inspection module.

2. The contact inspection device of claim 1, wherein the driving cylinder is coupled to the support in a rotatable way.

3. The contact inspection device of claim 1, wherein the driving cylinder is coupled to the contact inspection module in a rotatable way.

4. The contact inspection device of claim 1, wherein the driving cylinder comprises a piston rod which is movable back and forth in a direction oblique to the contact inspection module, and the contact inspection module moves obliquely based on an oblique movement of the piston rod.

5. The contact inspection device of claim 1, wherein the support comprises:

a first member coupled to the crank module; and a second member coupled to the first member with an angle therebetween.

6. The contact inspection device of claim 5, wherein the contact inspection module is coupled to the first member, and the driving cylinder is coupled to the second member.

7. The contact inspection device of claim 1, wherein the crank module comprises:

two pairs of connecting rods having a substantially same length as each other;

a plurality of first fasteners coupling a corresponding one of the connecting rods to the support in a rotatable way; and a plurality of second fasteners coupling a corresponding one of the connecting rods to the contact inspection module in a rotatable way.

8. The contact inspection device of claim 7, wherein each of the first fasteners comprises a bolt and a bearing, the bolt comprises:

a head;

a shank coupled to the bearing; and a thread fixed to the support, wherein the bearing is coupled to a corresponding one of the connecting rods in a rotatable way.

9. The contact inspection device of claim 7, wherein each of the second fasteners comprises a bolt and a bearing, the bolt comprises:

a head;

a shank coupled to the bearing; and a thread fixed to the contact inspection module, wherein the bearing is coupled to a corresponding one of the connecting rods in a rotatable way.

10. The contact inspection device of claim 1, wherein the contact inspection device further comprises a height adjusting member which adjusts a vertical position of the inspection terminal in the contact inspection device.

11. A contact inspection device comprising:

horizontal and vertical supports coupled to each other;

a contact inspection module including an inspection terminal which contacts and inspects a target;

a crank module coupled to the contact inspection module and the horizontal support and having a double crank structure; and a driving cylinder comprising a piston rod which is movable back and forth in an oblique direction and has an end rotatably coupled to the contact inspection module, wherein the driving cylinder is coupled to the vertical support in a rotatable way.

12. The contact inspection device of claim 11, wherein the crank module comprises:

two pairs of connecting rods having a substantially same length as each other, a plurality of first fasteners, wherein each of the first fasteners couples a corresponding one of the connecting rods to one of the horizontal and vertical supports in a rotatable way, and a plurality of second fasteners, wherein each of the second fasteners couples a corresponding one of the connecting rods to the contact inspection module in a rotatable way.

13. The contact inspection device of claim 12, wherein each of the first fasteners comprises a bolt and a bearing, the bolt comprises a head;

a shank coupled to the bearing; and a thread fixed to the horizontal support, wherein the bearing is coupled to a corresponding one of the connecting rods in a rotatable way.

14. The contact inspection device of claim 12, wherein each of the second fasteners comprises a bolt and a bearing, the bolt comprises:

a head;

a shank coupled to the bearing; and a thread fixed to the contact inspection module, wherein the bearing is coupled to a corresponding one of the connecting rods in a rotatable way.

15. The contact inspection device of claim 11, wherein the contact inspection device further comprises a height adjusting member which adjusts a vertical position of the inspection terminal in the contact inspection device.

16. A contact inspection device comprising:

a support;

a contact inspection module including an inspection terminal which contacts and inspects a target;

a driving member which applies a force to the contact inspection module to move, a direction of the applied force being oblique to the contact inspection module; and a horizontality maintaining member which maintains the contact inspection module to be substantially parallel with the support during a movement of the contact inspection module.

17. The contact inspection device of claim 16, wherein the driving member is coupled to the contact inspection module in a rotatable way, and the driving member comprises a piston rod which is movable back and forth in a direction oblique to the contact inspection module and has an end coupled to the contact inspection module.

18. The contact inspection device of claim 16, wherein the horizontality maintaining member comprises:

two pairs of connecting rods having a substantially same length as each other;

a plurality of first fasteners, each of which couples a corresponding one of the connecting rods to the support in a rotatable way; and a plurality of second fasteners, each of which couples a corresponding one of the connecting rods to the contact inspection module in a rotatable way.

19. The contact inspection device of claim 18, wherein each of the respective first fasteners comprises a bolt and a bearing, the bolt comprises a head;

a shank coupled to the bearing; and a thread fixed to the support, wherein the bearing is coupled to a corresponding one of the connecting rods in a rotatable way.

20. The contact inspection device of claim 18, wherein each of the second fasteners comprises a bolt and a bearing, the bolt comprises:

a head;

a shank coupled to the bearing; and a thread fixed to the contact inspection module, wherein the bearing is coupled to a corresponding one of the connecting rods in a rotatable way.

* * * * *